United States Patent
Kiehlbauch et al.

(10) Patent No.: US 7,517,804 B2
(45) Date of Patent: Apr. 14, 2009

(54) SELECTIVE ETCH CHEMISTRIES FOR FORMING HIGH ASPECT RATIO FEATURES AND ASSOCIATED STRUCTURES

(75) Inventors: Mark Kiehlbauch, Boise, ID (US); Ted Taylor, Boise, ID (US)

(73) Assignee: Micron Technologies, Inc., Boise, ID (US)

( * ) Notice: Subject to any disclaimer, the term of this patent is extended or adjusted under 35 U.S.C. 154(b) by 0 days.

(21) Appl. No.: 11/515,435

(22) Filed: Aug. 31, 2006

(65) Prior Publication Data
US 2008/0057724 A1 Mar. 6, 2008

(51) Int. Cl.
*H01L 21/302* (2006.01)
(52) U.S. Cl. ............... 438/714; 438/723; 216/80
(58) Field of Classification Search .......... 438/706, 438/710, 714, 723, 724, 725; 216/58, 80
See application file for complete search history.

(56) References Cited

U.S. PATENT DOCUMENTS

| | | | |
|---|---|---|---|
| 4,234,362 A | 11/1980 | Riseman | |
| 4,419,809 A | 12/1983 | Riseman et al. | |
| 4,432,132 A | 2/1984 | Kinsbron et al. | |
| 4,502,914 A | 3/1985 | Trumpp et al. | |
| 4,508,579 A | 4/1985 | Goth et al. | |
| 4,570,325 A | 2/1986 | Higuchi | |
| 4,615,764 A | 10/1986 | Bobbio et al. | |
| 4,648,937 A | 3/1987 | Ogura et al. | |
| 4,687,543 A | 8/1987 | Bowker | |
| 4,776,922 A | 10/1988 | Bhattascharyya et al. | |
| 4,838,991 A | 6/1989 | Cote et al. | |
| 4,855,017 A * | 8/1989 | Douglas ............ | 438/695 |
| 5,013,398 A | 5/1991 | Long et al. | |
| 5,013,400 A | 5/1991 | Kurasaki et al. | |
| 5,021,121 A | 6/1991 | Groechel et al. | |
| 5,022,958 A | 6/1991 | Favreau et al. | |

(Continued)

FOREIGN PATENT DOCUMENTS

EP 0227303 7/1987

(Continued)

OTHER PUBLICATIONS

Bergeron et al., "Resolution Enhancement Techniques for the 90nm Technology Node and Beyond," *Future Fab International*, Issue 15, 4 pages (Jul. 11, 2003).

(Continued)

*Primary Examiner*—Kin-Chan Chen
(74) *Attorney, Agent, or Firm*—Knobbe, Martens, Olson & Bear, LLP

(57) ABSTRACT

An interlevel dielectric layer, such as a silicon oxide layer, is selectively etched using a plasma etch chemistry including a silicon species and a halide species and also preferably a carbon species and an oxygen species. The silicon species can be generated from a silicon compound, such as $Si_xM_yH_z$, where "Si" is silicon, "M" is one or more halogens, "H" is hydrogen and $x \geq 1$, $y \geq 0$ and $z \geq 0$. The carbon species can be generated from a carbon compound, such as $C_\alpha M_\beta H_\gamma$, where "C" is carbon, "M" is one or more halogens, "H" is hydrogen, and $\alpha \geq 1$, $\beta \geq 0$ and $\gamma \geq 0$. The oxygen species can be generated from an oxygen compound, such as $O_2$, which can react with carbon to form a volatile compound.

16 Claims, 10 Drawing Sheets

U.S. PATENT DOCUMENTS

| | | | |
|---|---|---|---|
| 5,269,879 | A | 12/1993 | Rhoades et al. |
| 5,328,810 | A | 7/1994 | Lowrey et al. |
| 5,445,712 | A | 8/1995 | Yamagida |
| 5,514,885 | A | 5/1996 | Myrick |
| 5,529,657 | A | 6/1996 | Ishii |
| 5,595,627 | A | 1/1997 | Inazawa et al. |
| 5,611,888 | A | 3/1997 | Bosch et al. |
| 5,795,830 | A | 8/1998 | Cronin et al. |
| 5,820,261 | A | 10/1998 | Yam |
| 5,882,535 | A | 3/1999 | Stocks et al. |
| 6,004,862 | A | 12/1999 | Kim et al. |
| 6,042,998 | A | 3/2000 | Brueck et al. |
| 6,063,688 | A | 5/2000 | Doyle et al. |
| 6,071,789 | A | 6/2000 | Yang et al. |
| 6,090,304 | A | 7/2000 | Zhu et al. |
| 6,114,250 | A | 9/2000 | Ellingboe et al. |
| 6,117,786 | A | 9/2000 | Khajehnouri et al. |
| 6,159,862 | A | 12/2000 | Yamada et al. |
| 6,191,043 | B1 | 2/2001 | McReynolds |
| 6,242,165 | B1 | 6/2001 | Vaartstra |
| 6,291,334 | B1 | 9/2001 | Somekh |
| 6,297,554 | B1 | 10/2001 | Lin |
| 6,399,514 | B1 * | 6/2002 | Marks et al. .............. 438/729 |
| 6,403,488 | B1 | 6/2002 | Yang et al. |
| 6,475,867 | B1 | 11/2002 | Hui et al. |
| 6,548,396 | B2 | 4/2003 | Naik et al. |
| 6,573,030 | B1 | 6/2003 | Fairbairn et al. |
| 6,579,808 | B2 | 6/2003 | Cho et al. |
| 6,635,185 | B2 * | 10/2003 | Demmin et al. .............. 216/64 |
| 6,673,684 | B1 | 1/2004 | Huang et al. |
| 6,709,807 | B2 | 3/2004 | Hallock et al. |
| 6,709,991 | B1 * | 3/2004 | Kawahara et al. .......... 438/791 |
| 6,716,758 | B1 | 4/2004 | Donohoe et al. |
| 6,734,107 | B2 | 5/2004 | Lai et al. |
| 6,746,961 | B2 | 6/2004 | Ni et al. |
| 6,773,998 | B1 | 8/2004 | Fisher et al. |
| 6,784,108 | B1 * | 8/2004 | Donohoe et al. ........... 438/706 |
| 2001/0005631 | A1 | 6/2001 | Kim et al. |
| 2001/0031540 | A1 * | 10/2001 | Lim et al. .................. 438/424 |
| 2002/0042198 | A1 | 4/2002 | Bjarnason et al. |
| 2002/0094641 | A1 | 7/2002 | Shin et al. |
| 2003/0044722 | A1 | 3/2003 | Hsu et al. |
| 2003/0207207 | A1 | 11/2003 | Li |
| 2003/0209520 | A1 | 11/2003 | Chen et al. |
| 2003/0232504 | A1 | 12/2003 | Eppler et al. |
| 2004/0000534 | A1 | 1/2004 | Lipinski |
| 2004/0023475 | A1 | 2/2004 | Bonser et al. |
| 2004/0035826 | A1 | 2/2004 | Adachi et al. |
| 2004/0043475 | A1 | 3/2004 | Sharma |
| 2004/0043623 | A1 | 3/2004 | Liu et al. |
| 2004/0106257 | A1 | 6/2004 | Okamura et al. |
| 2004/0198015 | A1 * | 10/2004 | Drabe et al. ............... 438/391 |
| 2004/0259355 | A1 | 12/2004 | Yin et al. |
| 2005/0009215 | A1 | 1/2005 | Goto et al. |
| 2005/0026431 | A1 | 2/2005 | Kazumi et al. |
| 2005/0099078 | A1 | 5/2005 | Vanhaelemeersch et al. |
| 2005/0127416 | A1 | 6/2005 | Han et al. |
| 2005/0148144 | A1 * | 7/2005 | Chou et al. ................ 438/289 |
| 2005/0164478 | A1 | 7/2005 | Chan et al. |

FOREIGN PATENT DOCUMENTS

| | | |
|---|---|---|
| EP | 0491408 | 6/1992 |
| EP | 1357433 | 10/2003 |
| JP | 05343370 | 12/1993 |
| JP | H8-55908 | 2/1996 |
| JP | H8-55920 | 2/1996 |
| WO | WO 02/099864 A1 | 12/2002 |
| WO | WO 2005/010973 | 2/2005 |

OTHER PUBLICATIONS

Bhave et al., "Developer-soluble Gap fill materials for patterning metal trenches in Via-first Dual Damascene process," preprint of *Proceedings of SPIE: Advances in Resist Technology and Processing XXI*, vol. 5376, John L. Sturtevant, editor, 2004, 8 pages.

Chung et al., "Pattern multiplication method and the uniformity of nanoscale multiple lines*," *J.Vac.Sci.Technol.* B21(4), pp. 1491-1495 (Jul./Aug. 2003).

Chung et al., "Nanoscale Multi-Line Patterning Using Sidewall Structure," *Jpn., J. App. Phys.* vol. 41 Pt. 1, no. 6B, pp. 4410-4414 (2002).

Ha et al., "Reaction mechanism of trilevel resist etching in $O_2/SO_2$ plasma: controlling factors for sidewall passivation," *Vacuum*, vol. 51, Issue 4, pp. 519-524, Abstract (Dec. 1998).

Helmbold, A. and Meissner, D., *Thin Solid Films*, 283, 196-203 (1996).

Higashi et al., "Identifying front-end challenges for 90nm design," *Electronic Eng. Times Asia*, 3 pages, (Sep. 1, 2003).

Joubert et al., "Nanometer scale linewidth control during etching of polysilicon in high-density plasmas," *Microelectronic Engineering* 69 (2003), pp. 350-357.

Lopata, E. and Countrywood, J., "The effect of excitation frequency on emission spectra of polymerization plasmas," *J. Vac. Sci. Technol. A* 6(5) pp. 2949-2952 (Sep./Oct. 1988).

Mancini et al., "S-FIL for sub-80nm contact hole patterning," *Solid State Technology Magazine*, vol. 47, Issue 2, 4 pages (Feb. 2004).

Naulleau et al., "Line-edge roughness transfer function an dits application to determining mask effects in EUV resist characterization," *Applied Optics*, vol. 42, No. 17, pp. 3390-3397 (Jun. 10, 2003).

Oehrlein et al., "Pattern transfer into low dielctic materials by high-density plasma etching," *Solid State Tech.*, 8 pages (May 2000).

Peterson et al., "Approachese to reducing edge roughness and substrate poisoning of ESCAP photoresists," *Semiconductor Fabtech*, 8th Edition, pp. 183-188.

Samukawa et al., "Effects of Dischargae Frequency in Plasma Etching and Ultrahigh-Frequency Plasma Source for High-Performance Etching for Ultralage-Scale Integrated Circuits," *Jpn. J. Appl. Phys.* vol. 39, pp. 1583-1596, Part 1, No. 4A (Apr. 2000).

Samukawa, S. and Mukai, T., "New radical control method for high-performance dielectric etching with nonperfluorocompound gas chemistries in ultrahigh-frequency plasma," *J. Vac. Sci. Technol. A* 17(5), pp. 2551-2556 (Sep./Oct. 1999).

Samukawa, S. and Mukai, T., "Differences in radical generation due to chemical bonding of gas molecules in a high-density fluorocarbon plasma: Effects of the C=C bond in fluorocarbon gases," *J. Vac. Sci. Technol. A* 17(5), pp. 2463-2466 (Sep./Oct. 1999).

"Advanced lithography: probing the limits of lithography," http://www.tpd.tno.nl/smartsite93.html, 3 pages (Mar. 2004).

"TCP 9400DFM—Silicon Etch", Product Abstract; Available at http://www.lamrc.com/products_5.htm, (Jul. 2004); 1 page.

PCT Search Report; and the Written Opinion of the International Searching Authority; Application No. PCT/US2007/018398; mailed Jun. 3, 2008.

* cited by examiner

SELECTIVE ETCH CHEMISTRIES FOR FORMING HIGH ASPECT RATIO FEATURES AND ASSOCIATED STRUCTURES

BACKGROUND OF THE INVENTION

1. Field of the Invention

This invention, in various embodiments, relates generally to integrated circuit fabrication, particularly to methods for etching materials during integrated circuit fabrication and resulting structures.

2. Description of the Related Art

Integrated circuit fabrication conventionally includes forming a pattern of openings in a soft or hard mask and etching a material through the patterned mask to form openings in the material. In some applications, the etched material can, in turn, be used as a hard mask (or a second hard mask) for a subsequent pattern transfer to underlying materials. In damascene applications, the etched openings can take the form of, e.g., vias and/or trenches in insulating layers, which can be used to form various parts of an integrated circuit, including conductive contacts, interconnect lines and electrical devices such as capacitors and transistors.

Etching a material can involve performing a dry etch in which the material is exposed to a directional plasma, in which excited species are directed to the material at a tight distribution of angles. In principle, the dry etch forms uniform openings having relatively straight sidewalls. The excited species etch the material by forming volatile species with the material and/or by physically sputtering away the material, due to bombardment by the excited species.

Commonly etched materials include dielectrics, such as interlevel dielectrics. Openings in the dielectrics can be used to hold various conductive or semiconductive features in an integrated circuit, with the dielectric providing electrical insulation between the features.

Silicon oxide is a commonly used dielectric material, which can be formed in a variety of ways and can include various other constituents. A typical dry etch chemistry for silicon oxide-based materials includes hydrofluorocarbons, oxygen ($O_2$) and an inert gas. With reference to FIG. 1, the etch chemistry can be directed as plasma excited species through openings 10 in a masking layer 20 to etch a silicon oxide layer 30. With reference to FIG. 2, while the flow of the plasma excited species is predominantly vertical, the paths of some plasma excited species have a horizontal component which can cause etching of the sidewalls. This etching results in the formation of bowed sidewalls and, as a result, is commonly referred to as "bowing." The resultant thinning of insulating material between vias or trenches can lead to, among other things, breakage, shorting between conductive elements filling the vias/trenches or parasitic capacitance.

With continued reference to FIG. 2, carbon from the hydrofluorocarbons of the etch chemistry can deposit and polymerize in the openings 50 during etching, thereby forming polymer films 60. In general, the deposition occurs predominantly adjacent the walls of the masking layer 20, near the upper parts of openings 50. The polymer films 60 form a so-called neck at the thickest parts of the polymer films 60. In some cases, the polymer films 60 can grow so thick that they block or plug the openings 50. Typically, however, the openings 50 remain open and these necks can be beneficial, since they can form a "shadow" over the sidewalls 40, thereby protecting the sidewalls 40 from etching, thereby decreasing bowing.

While desirable for protecting the sidewalls 40, polymer films 60 with thick neck regions can also block the flow of some etchants into the openings 50; more etchant reaches the middle parts of the bottom of the openings 50 than the peripheral parts, causing material at the middle parts to be preferentially removed. As a result, the openings 50 can taper as they progress further into the layer 30. If the polymer film 60 deposits asymmetrically in the openings 50 or in different amounts between different openings 50, the tapering can be non-uniform, causing the formation of non-uniform openings 50. It will be appreciated that the formation of straight sidewalls 40 and uniform openings 50 are typically desired in integrated circuit fabrication to allow for, e.g., predictability, reliability and uniformity in the properties of the final product. Minimizing tapering by forming thinner polymer films 60 in the neck regions, however, may provide inadequate protection of the sidewalls 40, causing excessive bowing.

Accordingly, there is a need for methods and structures that allow effective control of the profiles of etched openings.

DETAILED DESCRIPTION OF THE PREFERRED EMBODIMENTS

Figure 1:
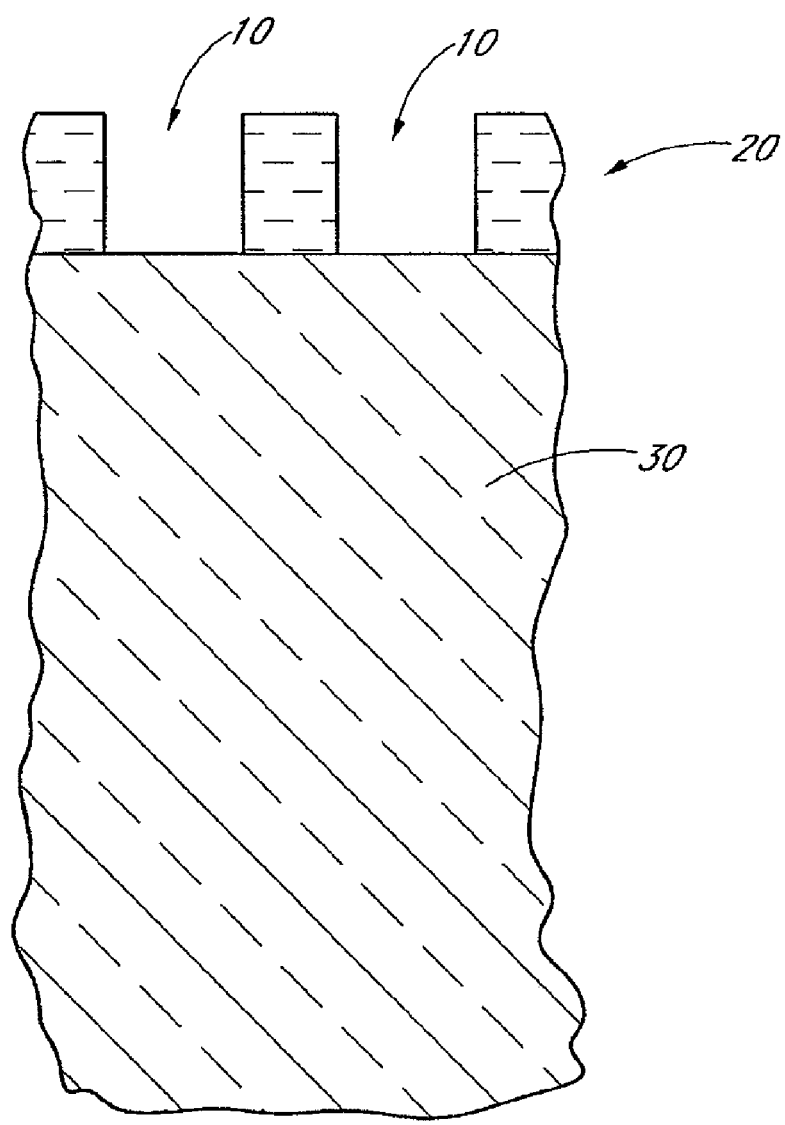
FIG. 1 is a cross-sectional side view of a partially fabricated integrated circuit having a patterned soft or hard mask overlying a material to be etched, in accordance with the prior art.
Figure 2:
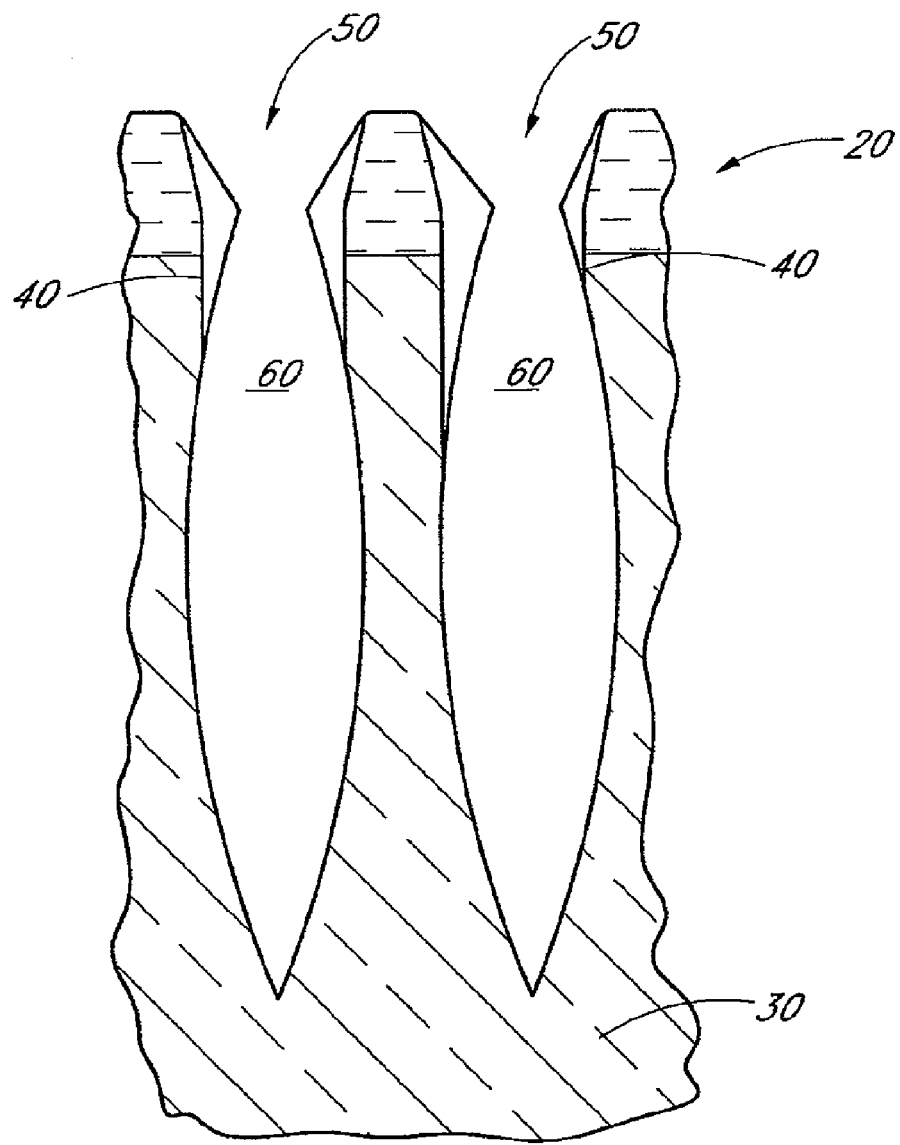
FIG. 2 is a cross-sectional side view of the partially fabricated integrated circuit of FIG. 1 after performing a directional plasma etch, in accordance with the prior art.

Embodiments of the invention provide etch chemistries which enable passivation of the walls of an opening etched in a dielectric material, in combination with high profile control and high profile uniformity. The etch chemistries include a silicon species and a halide species and also preferably include a carbon species and an oxygen species. At least one, and preferably, each of these species may be plasma excited species.

In some embodiments, the plasma excited species are derived or generated from silicon, carbon, and/or oxygen compounds. In some embodiments, the silicon compound can be represented as $Si_xM_yH_z$, where "Si" is silicon, "M" is one or more halogens (e.g., fluorine, bromine and/or chlorine), "H" is hydrogen and $x \geq 1$, $y \geq 0$ and $z \geq 0$ (preferably, $y \geq 1$).

As noted above, the etch chemistries may also include a carbon compound, which can be represented as $C_\alpha M_\beta H_\gamma$, where "C" is carbon, "M" is one or more halogens, "H" is hydrogen, and $\alpha \geq 1$, $\beta \geq 0$ and $\gamma \geq 0$ (preferably, $\beta \geq 1$). In addition, the etch chemistries may include an oxygen compound (e.g., molecular oxygen ($O_2$), hydrogen peroxide ($H_2O_2$) or water ($H_2O$)). It will be appreciated, that in some cases, it may be possible to utilize compounds from which two or more of the silicon, halogen, carbon and oxygen plasma excited species can be generated. For example, compounds formed of silicon, carbon and halogen atoms are contemplated.

The etch chemistries advantageously enable plasma etching of dielectric materials, such as an interlevel dielectric or silicon-containing dielectric materials, to form high aspect ratio openings. The silicon in the silicon compound can passivate the sidewalls of an opening forming a silicon layer on the sidewalls. The silicon layer is advantageously more resistant to etchants than, e.g., silicon-free polymer layers which may form using conventional fluorocarbon chemistries. This resistance to the etchants reduces bowing of the sidewalls relative to use of fluorocarbons alone. Moreover, as discussed further below, the silicon compound advantageously enables the degree of passivation and etching to be tailored, by appropriate selection of halogen constituents for the silicon compound and/or the carbon compound (when a carbon compound is included in the etch chemistry).

In addition, etch chemistries according to the disclosed embodiments (such as those including $SiF_4$) have advantageously been found to offer higher selectivity than many conventional etch chemistries. Moreover, the silicon passivating layer can dissipate charges which can build up during a plasma etch and which can repel plasma excited species from the surfaces defining an opening. By minimizing the charge build up, the etch rate can be increased, since more plasma excited species are allowed to reach the surfaces of the opening (e.g., via or trench) in the dielectric material.

Reference will now be made to the Figures, in which like numerals refer to like parts throughout. It will be appreciated that the drawings and parts therein are not necessarily drawn to scale.

Figure 3:
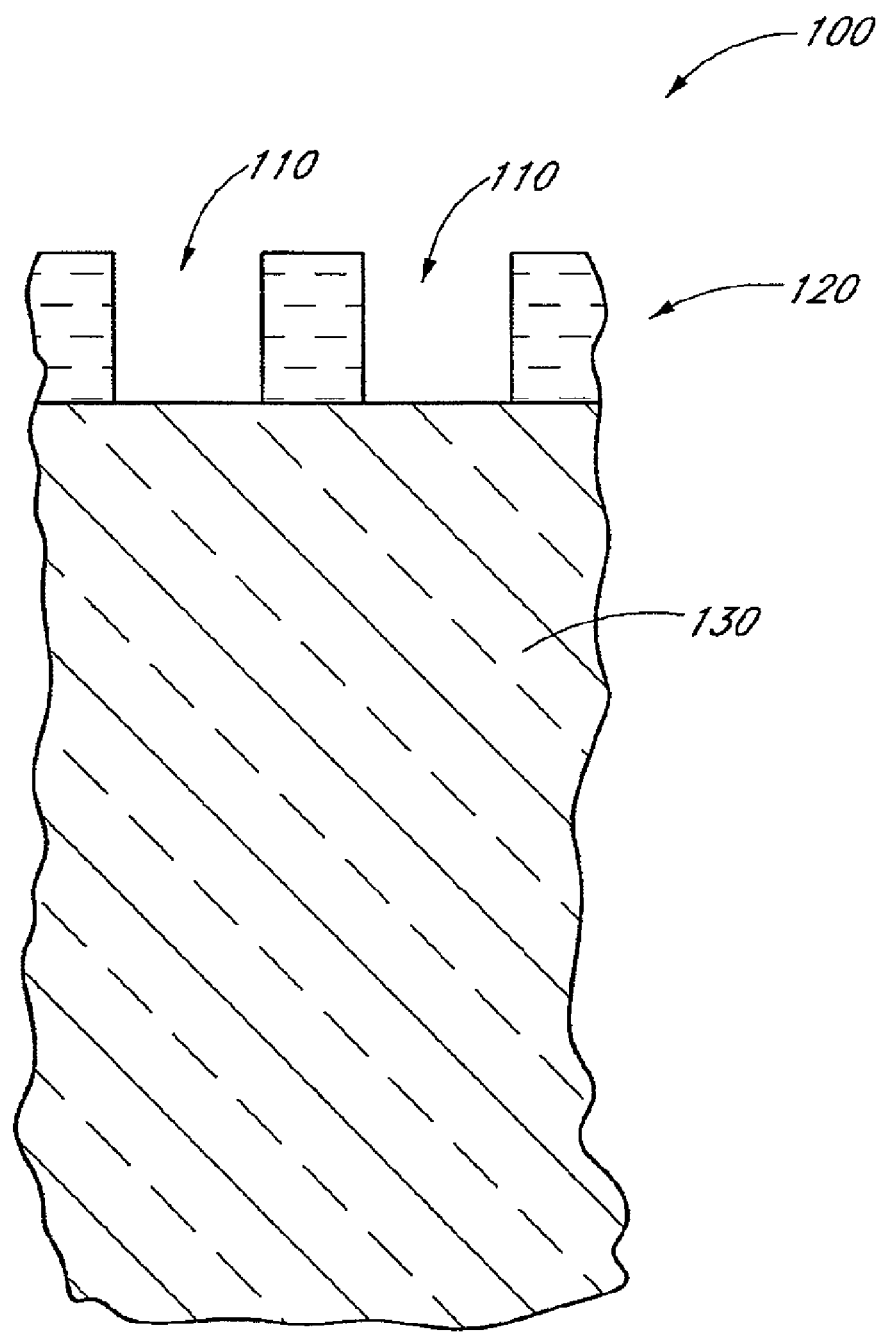
FIG. 3 is a cross-sectional side view of a partially fabricated integrated circuit having a patterned mask overlying a dielectric material, in accordance with embodiments of the invention.

With reference to FIG. 3, a partially fabricated integrated circuit 100 is illustrated. A patterned masking layer 120 overlies a layer 130 of a dielectric or insulating material which will be etched, as discussed below. The masking layer 120 includes a pattern of openings 110. In the illustrated embodiment, the patterned masking layer 120 is a carbon-containing hard mask layer, preferably an amorphous carbon layer, e.g., a transparent amorphous carbon layer which is highly transparent to light. Deposition techniques for forming a highly transparent carbon can be found in A. Helmbold, D. Meissner, Thin Solid Films, 283 (1996) 196-203, the entire disclosure of which is incorporated herein by reference.

The pattern of openings 110 may be formed after a pattern transfer from one or more overlying layers, such as a photoresist layer and one or more intervening hardmask layers. The photoresist can be exposed to radiation through a reticle and then developed to form a desired pattern which is transferred to the masking layer 120.

An example of another carbon material for the masking layer 120 is photoresist itself. In examples of other materials, the masking layer 120 may be formed of a silicon-containing material, e.g., silicon or silicon nitride, that can be selectively etched and selected against relative to the dielectric material of the layer 130.

The layer 130 comprises a dielectric material, which may be silicon-containing. For example, the layer 130 can be a form of silicon oxide and is preferably an interlevel dielectric (ILD) layer. In the illustrated embodiment, the layer 130 is formed of a silicon oxide, e.g., undoped silicon oxide such as silicon dioxide, fluorinated silicon oxide (FSG), silicate glasses such as borophosphate silicate glass (BPSG) and phosphate silicate glass (PSG), doped or undoped thermally grown silicon oxide, doped or undoped TEOS deposited silicon oxide, etc.

Figure 4:
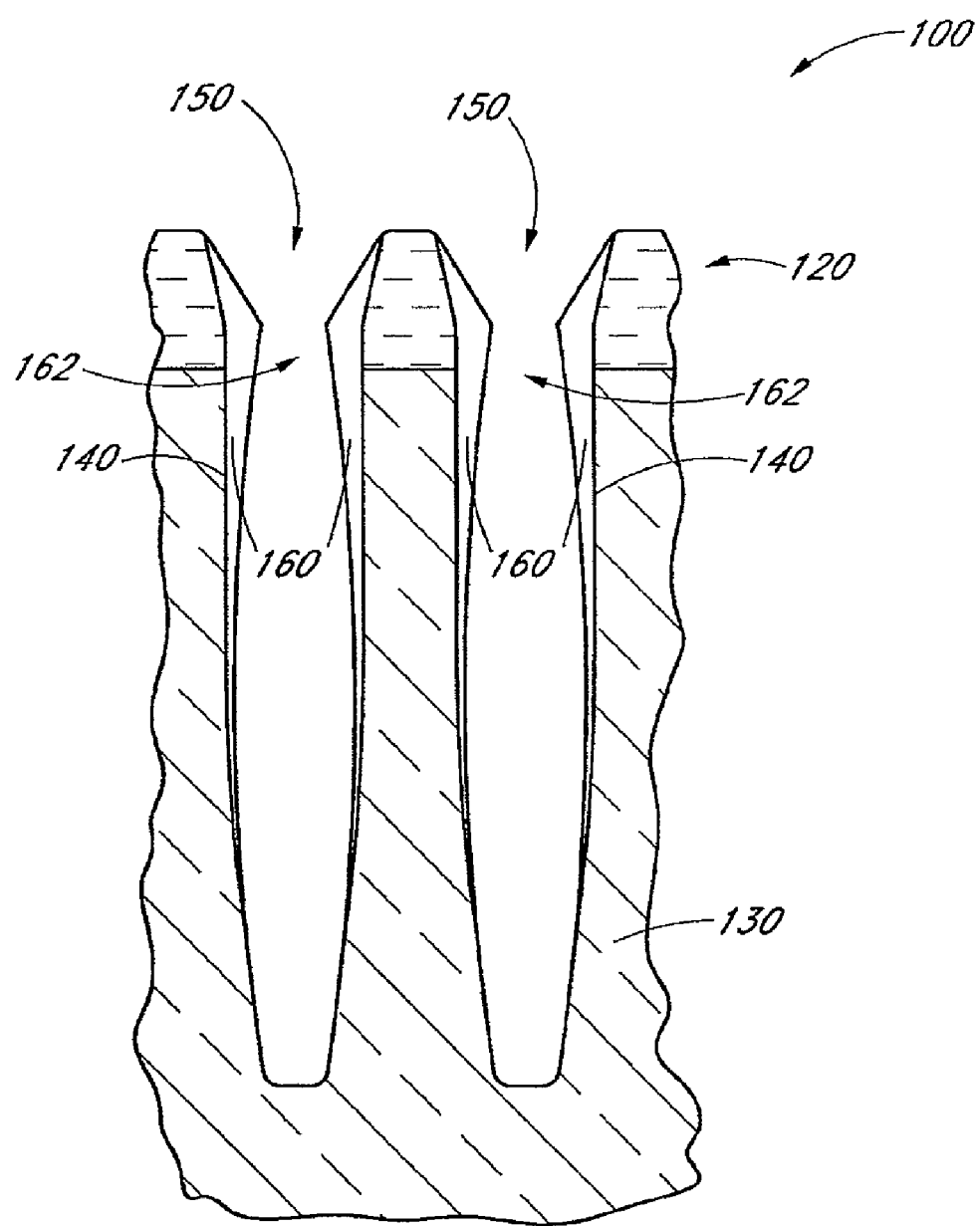
FIG. 4 is a cross-sectional side view of the partially fabricated integrated circuit of FIG. 3 after etching the dielectric material, in accordance with embodiments of the invention.

With reference to FIG. 4, the silicon oxide layer 130 has been subjected to a dry etch. During the etch, directional plasma excited species contact the layer 130 after traveling through the openings 110 (FIG. 3) in the masking layer 120, thereby etching the layer 130 and forming the openings 150. It will be appreciated that "plasma-excited species" refers to radicals, ions or other excited species generated via application of energy to a gas. Plasma-excited species may be generated using a direct plasma generator (i.e., "in situ" or "direct" plasma generation) inside a reaction chamber containing a substrate or using a remote plasma generator (i.e., "ex situ" or "remote" plasma generation). The plasma-excited species may be generated in situ. Energy may be applied (or coupled) to a gas via a variety of methods, such as inductive coupling, ultraviolet radiation, microwaves, capacitive coupling, application of RF power, etc. In the absence of coupling energy, plasma generation is terminated. Plasma-excited species may include, without limitation, halide radicals and ions. During etching, plasma-excited species (e.g., $F^+$) are preferably directed to the surface of a material to by etched, preferably via application of an electric field, to provide a directional or anisotropic etch.

The plasma species are generated from an etch chemistry including a silicon compound and, more preferably, a silicon and halogen compound. In embodiments, the silicon compound can be represented generally by $Si_x M_y H_z$, where "Si" is silicon; "M" is one or more halogens such as fluorine, bromine, chlorine or iodine; "H" is hydrogen and $x \geq 1$, $y \geq 0$ and $z \geq 0$. More preferably, the silicon compound includes a halogen to aid in etching of the layer 130, so that $y \geq 1$. For example, in some embodiments, the silicon compound is $SiF_4$, which is a relatively aggressive etching compound. Examples of other silicon compounds, which are less aggressive, as discussed below, are $SiBr_2F_2$, $SiBr_2H_2$, $SiBr_4$, $SiBr_3H$, and $SiH_4$. In addition, the etch chemistry can also include combinations of different silicon compounds. The etch chemistry is preferably provided to a reaction chamber containing the partially fabricated integrated circuit 100 with the aid of an inert carrier gas (e.g., helium (He), argon (Ar) and neon (Ne)).

Preferably, the etch chemistry also includes a carbon compound. The carbon compound can be represented as $C_\alpha M_\beta H_\gamma$, wherein "C" is carbon, "M" is one or more halogens, "H" is hydrogen, and $\alpha \geq 1$, $\beta \geq 0$ and $\gamma \geq 0$. More preferably, at least one halogen is included to aid in etching of the layer 130, so that $\beta \geq 1$. Examples of carbon compounds include $CF_4$ and $C_2Br_6$. Combinations of different carbon containing compounds are also contemplated.

Without being limited by theory, it is believed that sputtering of material of the layer 130 by physical bombardment with excited species, along with the formation of volatile compounds due to reaction of the halide species (from the carbon or the silicon compounds) with, e.g., the silicon of the dielectric layer 130 causes removal of material from the layer 130, thereby forming the openings 150. To aid in the removal of material, the etch chemistry preferably also includes the carbon compound. The carbon atoms advantageously react with, e.g., oxygen atoms from silicon oxide, to form volatile carbon and oxygen compounds (e.g., CO and/or $CO_2$) which aid in removal of the oxygen atoms.

In some embodiments, the etch chemistry preferably also includes an oxygen compound, which is preferably capable of combusting carbon. An example of an oxygen compound is molecular oxygen ($O_2$).

Without being limited by theory, the oxygen compound can be used to increase process latitude by removing carbon from the openings 150 by forming volatile compounds with the carbon (e.g., through a "combustion" reaction). For example, while carbon from the carbon compound can be utilized to remove oxygen of the dielectric layer 130 from the openings 150, in some applications, it may be desirable to deliver an excess of the carbon compound to the openings 150, to, e.g., increase the aggressiveness of the etch. The use of the oxygen compound advantageously allows greater process latitude in the amount of the carbon compound delivered to the openings 150 since the oxygen compound can remove carbon that would otherwise accumulate in the openings 150.

It will be appreciated that the numerical values for the various subscripts (such as x, y, z, $\alpha$, $\beta$, $\gamma$ and $\delta$) for the various compounds disclosed herein are limited by the number of bonds which can be formed by the various constituent atoms forming the compounds. For example, the skilled artisan will understand that silicon and carbon atoms form four bonds to other atoms, while halogens and hydrogen will form a bond with a single other atom.

With continued reference to FIG. 4, the etch chemistry advantageously deposits passivating films 160 on sidewalls 140 of the openings 150, including on surfaces of the masking layer 120. Without being limited by theory, the silicon of the silicon compound is believed to passivate the sidewalls 140 by depositing and polymerizing to form the passivating films 160. Additionally, carbon from the carbon compound can also deposit and polymerize to aid in formation of the passivating films 160, particularly on surfaces of the masking layer 130. In some cases, it is believed that, towards the top of the openings 150, on the surfaces of the masking layer 120, the passivating films 160 can be formed of a carbon-containing polymer (formed predominantly of carbon), while lower into the openings 150, on the of the dielectric layer 130, the passivating films 160 can be a silicon-containing polymer (formed predominantly of silicon), such as a silicone.

Advantageously, silicon in the passivating films 160 renders the film highly resistant to etching by etchants. Consequently, the passivating films 160 protects the sidewalls 140 from etching, thereby minimizing bowing. It will be understood that some etching of the passivating films 160 does occur, although this is considered minimal in comparison to conventional etches using fluorocarbons without the silicon compounds of the preferred embodiments. Rather than allowing the passivating films 160 to remain completely unetched, the etch chemistry is preferably selected to etch the passivating films 160 at a rate sufficient to prevent the passivating films 160 from growing to close off the openings 150, while still allowing the passivating films 160 to protect the sidewalls 140 and to minimize bowing.

Moreover, the relatively high etch resistance of the passivating films 160 allows a thinner passivating layer to be formed, thereby increasing the size of the opening at the neck region 162. This relatively narrow passivating layer 160 and relatively wide neck opening 162 advantageously contributes to improved profile control. Advantageously, the blocking of etchants by the neck can be decreased, thereby reducing tapering of the openings 150. As a result, straighter, more vertical sidewalls 140 can be formed and the width of the openings 150 are more uniform through the height of the opening. In addition, the reduced taper of the openings 150 may advantageously increase the etch rate by effectively decreasing the aspect ratio of the feature.

It will be appreciated that the passivating films 160 can advantageously increase the desired vertical etch rate. Due to the generation and use of plasma excited species during the etch, charges can build up on the sidewalls 140. These charges can decrease the etch rate by repelling charged etchant species and undesirably reducing the number of such charged excited species which impinge on the bottom of the openings 150. Advantageously, the silicon-containing layer is semi-conductive, allowing for dissipation of charges and minimizing charge build-up. As a result, more charged etchant species can reach the bottom of the openings 150, to etch material at that bottom, thereby increasing the etch rate. For example, the bottom of the openings 150 may charge positively, causing repulsion of positive ions of the etch chemistry. Reducing the positive charge at the bottom of the opening 150, via the deposition of a conducting or semiconducting film, such as the silicon-containing film 160, may increase the etch rate by reducing this repulsion.

The relative degrees of passivation and etching strength of the etch chemistry can be tailored by, among other parameters, appropriate selection of the halogen(s). It will be appreciated that the relative etching strengths of various halogens can be generalized as F>Cl>Br>I, ranging from most aggressive (F) to least aggressive (I). Combinations of halogens and hydrogens (e.g., $SiF_aCl_bBr_cH_d$) can be utilized to further tailor the relative degree of passivation and the etching strength. As the degree of passivation of the sidewalls 140 and the rate of etching of the passivation film 160 are preferably balanced in order to minimize bowing, the ability to tailor the etch strength of the etch chemistry, including the silicon compound, advantageously facilitates this balancing. In some embodiments, where a silicon compound is used in conjunction with more aggressive etchants, the silicon compound can be, e.g., $SiH_4$, allowing it to function principally as a passivating agent, while halide etchants are provide, e.g., as fluorocarbons.

As discussed above, in some embodiments, it will be appreciated that profile control over the openings 150 can be achieved by appropriately selecting process parameters (e.g., plasma energy, plasma pulse duration, substrate temperature, reactor pressure and flow rates) and by selecting the compositions and relative ratios of the silicon, carbon and oxygen compounds in the etch chemistries delivered to the reaction chamber. For example, the aggressiveness of the etch chemistry can be modified by selecting silicon and/or carbon compounds having halogens with greater or lesser etch strengths. In some embodiments, only the silicon compound is included in the etch chemistry (in which case, it contains halogen, but not carbon species), although, preferably, the carbon compound, and, more preferably, the carbon and the oxygen compounds are also included.

It will also be appreciate that the various compounds of the etch chemistry can be flowed separately or intermittently into the reaction chamber. In some embodiments, the carbon compound and the oxygen compound can be flowed continuously into the chamber, while the silicon compound is flowed intermittently into the chamber. The carbon compound can form a passivating film on the sidewalls of the mask opening. However, as the etch progresses, the overlying masking layer 120 and any passivating film on surfaces of the masking layer 120 is also etched. As a result, the masking layer 120 may be worn thin and the neck and any bow formed by the etch may penetrate into the dielectric layer 130. For example, as the masking layer 120 becomes progressively thinner, the carbon passivating film may also be etched, so that the neck formed by the carbon passivating film is formed progressively lower in the opening 150. In some cases, the neck may move from the sidewalls of the mask opening to the sidewalls of the dielectric layer 130. This lowered neck may leave parts of the dielectric layer 130 above the neck unprotected from etchant. Before this occurs, to increase the resistance of the passivating film to the etch, thereby reducing downward movement of the neck and reducing thinning of the masking layer 120, the silicon compound can be added to the etch chemistry. In addition to providing etch resistance, the silicon compound may deposit on the masking layer 120, to increase the height of the mask and counteract thinning of the masking layer 120. To prevent excessive deposition or growth of the passivating film, the flow of the silicon compound can be stopped for a time. The silicon compound can subsequently be added again before thinning of the masking layer 120 and etching of the passivating film again progresses to undesirable levels. Thus, the silicon-containing passivating agent can be cyclically flowed in temporally-separated pulses while the carbon-containing ethants are either continuously flowed or alternated with the silicon-containing passivating agent.

Figure 5:
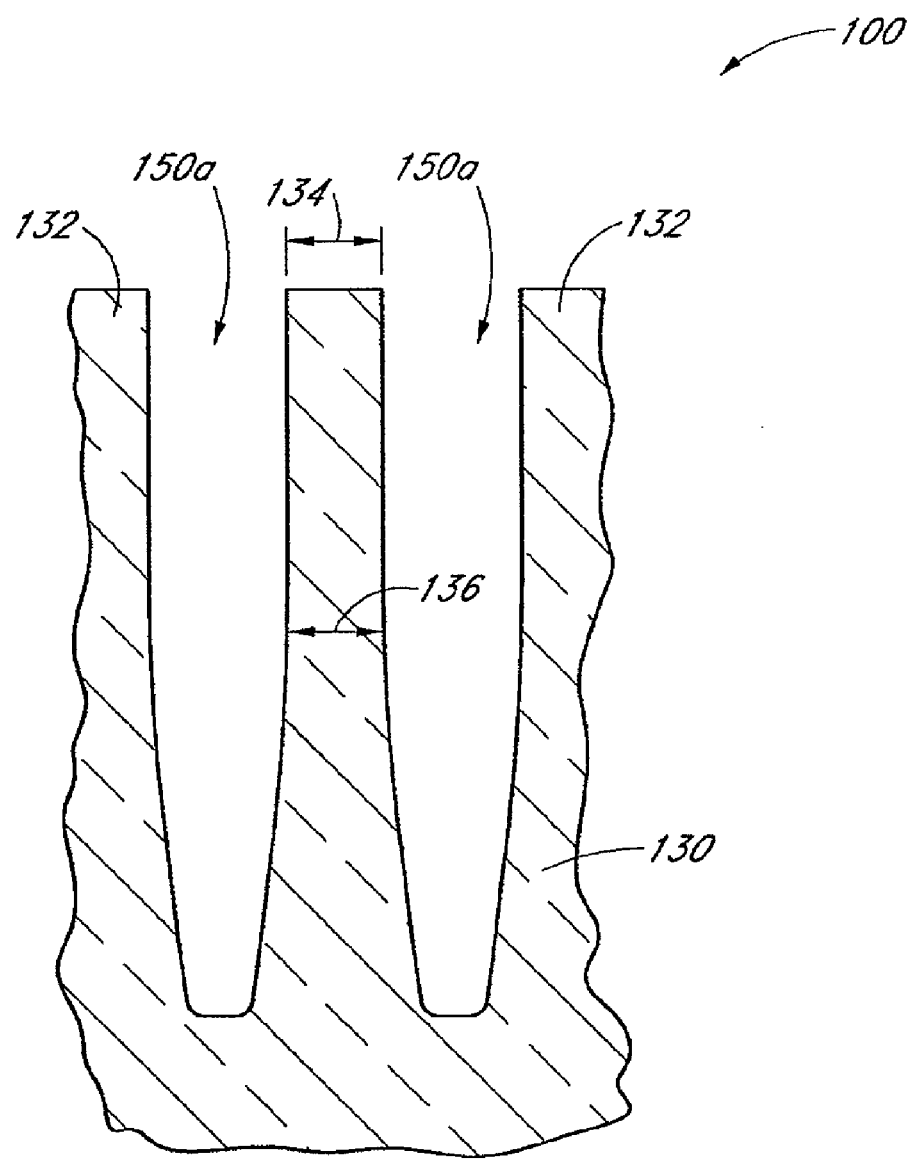
FIG. 5 is a cross-sectional side view of the partially fabricated integrated circuit of FIG. 4 after removing the mask and cleaning the etched openings, in accordance with embodiments of the invention.
Figure 6:
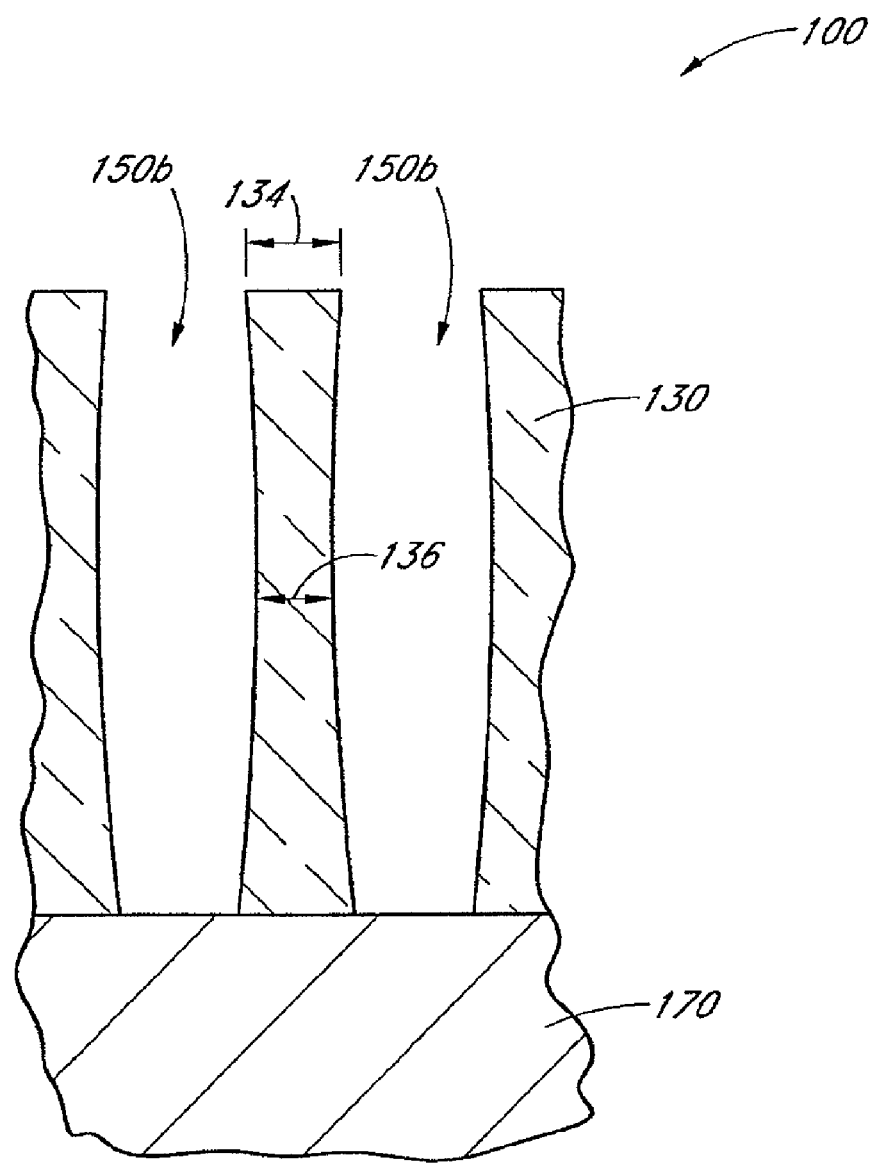
FIG. 6 is a cross-sectional side view of the partially fabricated integrated circuit of FIG. 3 after etching through the dielectric material, removing the mask and cleaning the etched openings, in accordance with other embodiments of the invention.

With reference to FIG. 5, after the etch, the masking layer 120 can be removed and the openings 150 can be subjected to a post-etch cleaning process to form cleaned openings 150a. It will be appreciated that the masking layer 120 can be subjected to an etch or other process suitable for removing material which forms that layer. For example, an ashing process can be used to remove photoresist. The passivating films 160 can be removed by various processes, including an ashing process using fluorine-containing gas, e.g., $CF_4$ in combination with $O_2$ and $N_2$. In some cases in which high amounts of silicon are used, silicon from the etch chemistry may form difficult to remove silicon compounds on the sidewalls 140 (FIG. 4). In such cases, a bias stripper, rather a microwave stripper conventionally used for stripping processes, may be applied to remove the silicon compounds While shown extending only partly through the layer 130, in some embodiments, it will be appreciated that the etch can be performed such that an opening extending completely through the layer 130 is formed. With reference to FIG. 6, an underlying layer 170 acts as an etch stop; the etch is selective to the underlying layer 170 relative to the material forming the layer 130. As a result, openings 150b are formed extending completely through the layer 130, thereby exposing the underlying layer 170. The The partially fabricated integrated circuit 100 can then be further processed to form a completed integrated circuit. For example, with continued reference to FIG. 6, the openings 150b can be filled with material to form various features, such as conductive contacts in cases when the layer 170 includes a conductive feature, such as an interconnect. In other applications, the etched layer 130 can be used as a mask to transfer a pattern defined by the openings 150b to the underlying layer 170. In another example, with reference to FIG. 6, the openings 150b can also be filled with material to form various electrical devices, such as transistors or capacitors. For example, the openings 150b can be used to form a polysilicon plug for contact to container-shaped capacitors, which can also be formed in openings 150b.

Advantageously, processing according to the preferred embodiments allows the formation of uniform, high aspect ratio features or openings. For example, the openings 150a (FIG. 5) or 150b (FIG. 6) can have an aspect ratio (depth-to-width at the top of the openings) of about 15:1 or more, about 20:1 or, more preferably, about 30:1 or more, or about 40:1 or more. The openings 150a or 150b can also be advantageously narrow, with widths of 100 nm or less, and as little as about 80 nm or less, or about 65 nm. The openings 150a or 150b may be highly uniform through their depth, having variations in widths of less than about 10 nm RMS (within 3 sigma).

Moreover, the disclosed embodiments advantageously allow improvements, over conventional etches, in etch rates, in etch selectivity, in uniformity of features formed and in the aspect ratio of the openings which can be formed. In these categories, improvements of 15% and, more preferably, 25% are possible. For example, these embodiments allow etch rates of about 50-60 Å/min. or more and selectivity of about 4:1 or more (for, e.g., the ratio of the etch rate for a silicon oxide layer and the etch rate for amorphous carbon layer) in forming the holes 150a, 150b (FIGS. 5 and 6).

In addition, the openings which are formed have more uniform, nearly vertical sidewalls. It will be appreciated that the openings 150a, 150b having material, or dividers, 132 between the openings and that the amount of bowing of the sidewalls 140 can be characterized with reference to the dividers 132. The ratio of a top width 134 (the width of the dividers 132 at the top of the openings 150a) to a bow width 136 (the width of the dividers 132 at their narrowest point) may be less than or equal to about 1.4:1, less than or equal to about 1.3:1 or even less than or equal to about 1.2:1. In some embodiments, the ratio of the top width 134 to the bow width 136 is about 1.15:1. Thus, the degree of bowing is advantageously low. It will be appreciated that the dividers 132 can function as insulating separation between conductors to be formed in the openings 150a, 150b. For example, for openings of the same aspect ratio, performing conventional etches using the same etch rate and having the same selectivity may result in a ratio of top width 134 to bow width 136 which is about 25-30% larger than that resulting from some embodiments of the invention.

EXAMPLE

A silicon oxide dielectric layer was etched through an amorphous carbon masking layer to form trenches. The etch was performed in a dual frequency capacitively coupled reactor, commercially available from Tokyo Electron Limited of Tokyo, Japan. The etch chemistry included $SiF_4$, $C_4F_8$, and $O_2$, provided to the reaction chamber with an argon carrier gas. The $SiF_4$ was provided to the reaction chamber at a flow rate of about 18 standard cubic centimeters per minute (sccm), the $C_4F_8$ was flowed at about 35 sccm, and the $O_2$ was flowed at 13 sccm. The substrate temperature was about 50° C. and the reaction chamber pressure was about 35 mTorr. 1500 W of power at 60 MHz was coupled to the top electrode and 2750 W of power at 2 MHz was coupled to the bottom electrode. The resultant trenches had an aspect ratio of about 25:1 and a width of about 90 nm at their tops.

Figure 7:
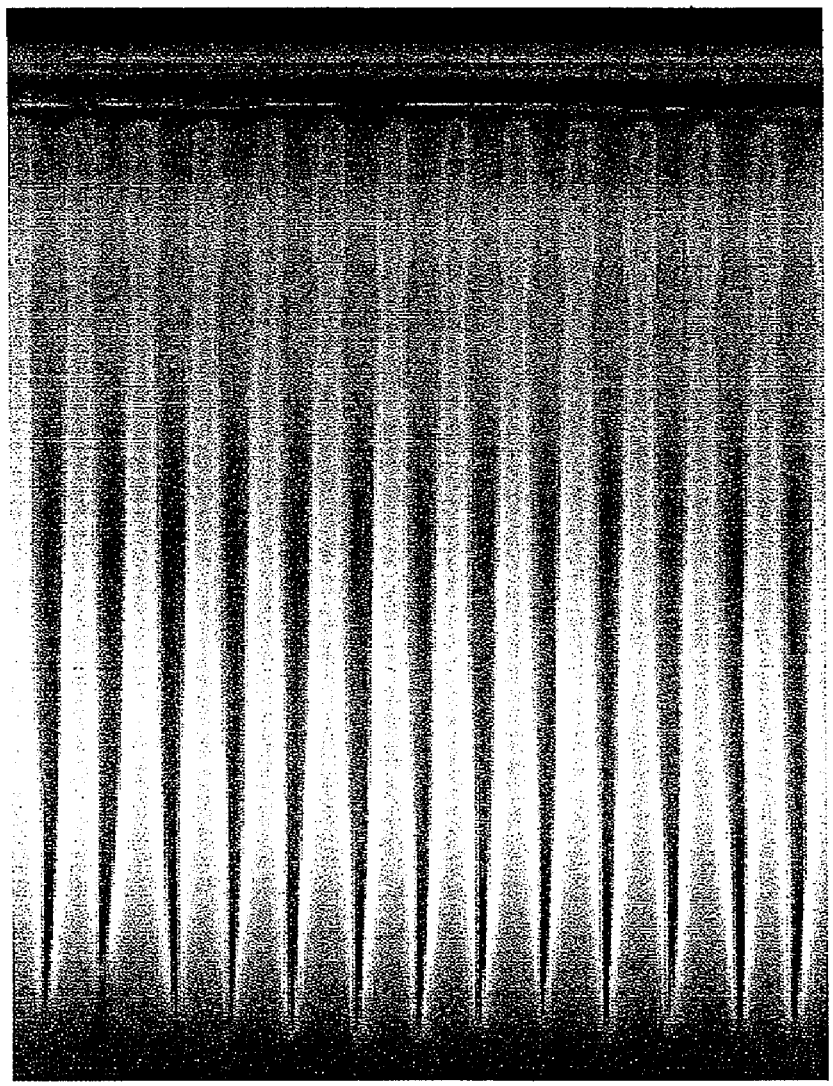
FIG. 7 is a scanning electron micrograph of a trench formed in accordance with embodiments of the invention.

With reference to FIG. 7, a scanning electron micrograph of the resultant trenches is show. Advantageously, the trenches have exceptionally uniform and straight sidewalls.

Figure 8A:
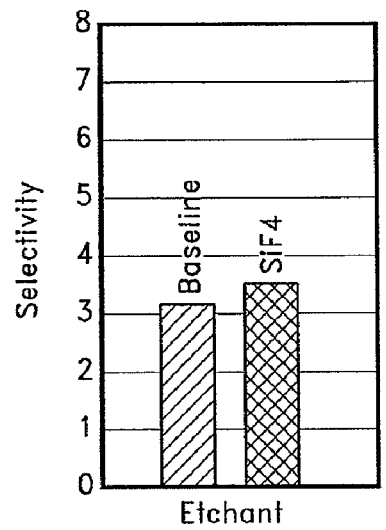
FIGS. 8A-8E are charts showing properties of etches according to embodiments of the invention and according to the prior art.
Figure 8B:
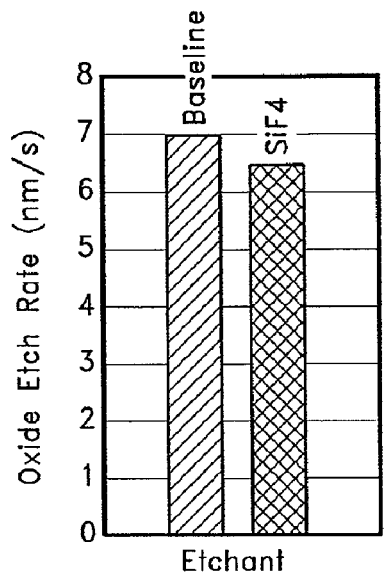
Figure 8C:
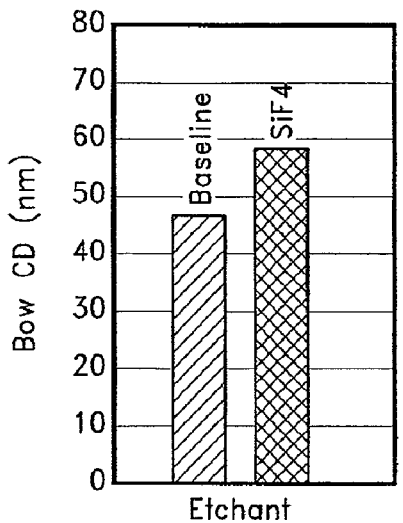
Figure 8D:
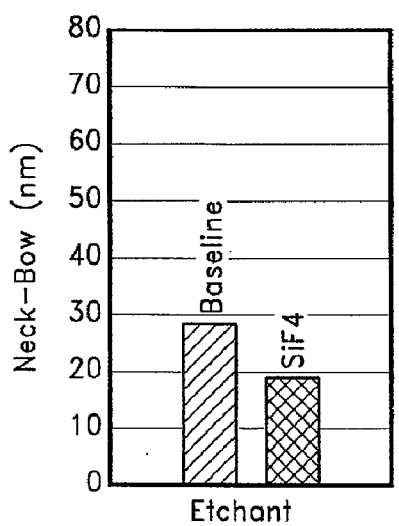

With reference to FIGS. 8A-8E, the etch was found to give various improvements over a baseline etch utilizing an etch chemistry consisting of $C_4F_8$ and $O_2$ with an Ar carrier gas. Notably, the selectivity of the etch for the silicon oxide relative to the amorphous carbon hard mask was increased (FIG. 8A), while still achieving a high etch rate (FIG. 8B). In addition, the bow CD (the width of the un-etched dielectric material between trenches), or the bow width, was increased, indicating that bowing has decreased (FIG. 8C). Also, the difference between the neck and the bow dimensions (the neck minus the bow dimension), was advantageously low, indicating that the walls of the trenches were exceptionally straight (FIG. 8D).

Figure 8E:
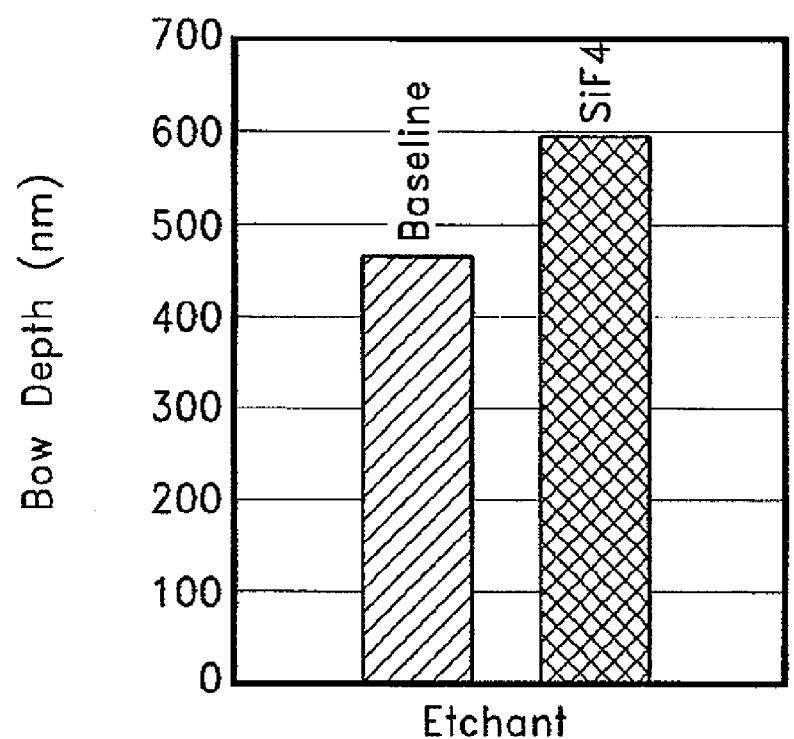

Also, the depth of the occurrence of any bowing was lower that the baseline chemistry (FIG. 8E). Advantageously, this facilitates control over the degree of bowing and the profile of the etched opening. For example, in some embodiments, the etch chemistry can be changed during the course of the etch so that any bowing is distributed more evenly over the height of the opening. For example, the etch chemistry can be varied from a chemistry which gives a relatively shallow bow depth (e.g., the baseline chemistry) to one which gives a relatively deep bow depth ($SiF_4$). As a result, any bowing can be distributed over the height of the opening, so that the amount of bowing at a given height is reduced.

It will be appreciated from the description herein that the invention includes various embodiments. For example, according to one embodiment of the invention, a method is provided for forming an integrated circuit. The method comprises providing an interlevel dielectric (ILD) layer with an overlying masking layer in a reaction chamber. The masking layer has openings exposing parts of the ILD layer. Plasma excited species are generated from a gas comprising a silicon compound. The ILD layer is etched by contacting the exposed parts of the ILD layer with the plasma excited species.

According to another embodiment of the invention, a method for semiconductor processing is provided. The method comprises etching a layer of a silicon-containing dielectric by contacting exposed portions of the silicon-containing dielectric layer with a chemistry comprising a halogen compound and a silicon compound. At least one of the compounds is in a plasma-excited state.

According to yet another embodiment of the invention, a method for forming high aspect ratio features in an interlevel dielectric (ILD) layer over a semiconductor substrate is provided. The method comprises providing a masking layer over the ILD layer. The masking layer has one or more openings partially exposing the dielectric layer. Exposed portions of the ILD layer are selectively etched relative to the masking layer using an etching chemistry. The etching chemistry comprises a silicon species, a halide species, a carbon species and an oxygen species.

According to another embodiment of the invention, a partially fabricated integrated circuit having an interlevel dielectric (ILD) layer is provided. The partially fabricated integrated circuit comprises a plurality of features formed in the ILD layer. The features have sidewalls defined by openings in the ILD layer. A width at a top of each of the features defines a top width and a minimum width of the features defines a bow width. A bow ratio of the top width to the bow width is less than or equal to about 1.4:1. The partially fabricated integrated circuit also comprises a silicon polymer film on at least part of the sidewalls.

In addition to the above disclosure, it will also be appreciated by those skilled in the art that various omissions, additions and modifications may be made to the methods and structures described above without departing from the scope of the invention. All such modifications and changes are intended to fall within the scope of the invention, as defined by the appended claims.

We claim:

1. A method for forming an integrated circuit, comprising:
   providing an interlevel dielectric (ILD) layer with an overlying masking layer in a reaction chamber, the masking layer having openings exposing parts of the ILD layer;
   etching an upper portion of the ILD layer by contacting the exposed parts of the ILD layer with a chemistry comprising plasma excited species generated from a carbon compound;
   generating plasma excited species from a gas comprising a silicon compound; and
   etching a lower portion of the ILD layer by adding the plasma excited species to the chemistry and contacting the exposed parts of the ILD layer with the plasma excited species, wherein etching the upper portion is initially performed without exposing the ILD layer to the plasma excited species generated from the gas comprising the silicon compound.

2. The method of claim 1, wherein generating plasma excited species from the gas comprises generating plasma excited species from $Si_xM_yH_z$, wherein Si is silicon, H is hydrogen and M is one or more halogens selected from the group consisting of fluorine (F), bromine (Br), chlorine (Cl) and iodine (I), and wherein $x \geq 1$, $y \geq 0$ and $z \geq 0$.

3. The method of claim 2, wherein generating plasma excited species from the gas comprises generating plasma excited species from $Si_xM_yH_z$ in which $x \geq 1$, $y \geq 1$ and $z \geq 0$.

4. The method of claim 2, wherein contacting the exposed parts of the ILD layer with plasma excited species generated from the carbon compound comprises generating plasma excited species from $C_\alpha M_\beta H_\gamma$, wherein C is carbon, H is hydrogen and M is one or more halogens selected from the group consisting of fluorine (F), bromine (Br), chlorine (Cl) and iodine (I), and wherein $\alpha \geq 1$, $\beta \geq 0$ and $\gamma \geq 0$.

5. The method of claim 4, wherein generating plasma excited species from $C_\alpha M_\beta H_\gamma$ comprises generating plasma excited species from $C_\alpha M_\beta H_\gamma$ in which $\alpha \geq 1$, $\beta \geq 1$ and $\gamma \geq 0$.

6. The method of claim 1, further comprising contacting the exposed parts of the ILD layer with plasma excited species generated from an oxygen compound.

7. The method of claim 6, wherein contacting the exposed parts of the ILD layer with plasma excited species generated from the oxygen compound comprises generating plasma excited species from molecular oxygen ($O_2$).

8. The method of claim 6, wherein generating plasma excited species comprises flowing the silicon compound, the carbon compound and the oxygen compound in an inert carrier gas selected from the group consisting of helium (He), argon (Ar) and neon (Ne).

9. The method of claim 6, wherein contacting the exposed parts of the ILD layer with the plasma excited species generated from the silicon compound is performed in temporally separated pulses.

10. The method of claim 6, wherein contacting the exposed parts of the ILD layer with the plasma excited species generated from the carbon compound and contacting the exposed parts of the ILD layer with plasma excited species generated from an oxygen compound are performed continuously during and between pulses of the plasma excited species generated from the silicon compound.

11. The method of claim 1, wherein contacting the exposed parts of the ILD layer forms a passivation layer on at least parts of sidewalls of the openings.

12. The method of claim 1, wherein the ILD layer is formed of silicon oxide.

13. The method of claim 12, wherein the masking layer is formed of a carbon material.

14. The method of claim 13, wherein the carbon layer is formed of a photoresist.

15. The method of claim 13, wherein the carbon layer is formed of amorphous carbon.

16. The method of claim 1, wherein generating the plasma is performed inside the reaction chamber.

* * * * *